United States Patent
Kim et al.

(10) Patent No.: US 8,603,849 B2
(45) Date of Patent: Dec. 10, 2013

(54) QUANTUM DOT PHOTOVOLTAIC DEVICE AND MANUFACTURING METHOD THEREOF

(75) Inventors: Kyung Joong Kim, Daejeon (KR); Woo Lee, Daejeon (KR); Yong Sung Kim, Daejeon (KR); Young Heon Kim, Daejeon (KR); Seung hui Hong, Seoul (KR); Wan Soo Yun, Daejeon (KR); Sang Woo Kang, Daejeon (KR)

(73) Assignee: Korea Research Institute of Standards and Science, Daejeon (KR)

( * ) Notice: Subject to any disclaimer, the term of this patent is extended or adjusted under 35 U.S.C. 154(b) by 158 days.

(21) Appl. No.: 13/061,297

(22) PCT Filed: Aug. 28, 2009

(86) PCT No.: PCT/KR2009/004852
§ 371 (c)(1),
(2), (4) Date: Feb. 28, 2011

(87) PCT Pub. No.: WO2010/024629
PCT Pub. Date: Mar. 4, 2010

(65) Prior Publication Data
US 2011/0146775 A1    Jun. 23, 2011

(30) Foreign Application Priority Data

Aug. 28, 2008   (KR) .................. 10-2008-0084695

(51) Int. Cl.
*H01L 31/0264*    (2006.01)
(52) U.S. Cl.
USPC ............................................ 438/57; 136/261
(58) Field of Classification Search
USPC ................. 438/69, 85; 136/256, 258, 261
See application file for complete search history.

(56) References Cited

U.S. PATENT DOCUMENTS

| | | | |
|---|---|---|---|
| 7,511,217 B1 * | 3/2009 | Roscheisen et al. | 136/263 |
| 2003/0137023 A1 | 7/2003 | Stegmuller | |
| 2005/0098205 A1 * | 5/2005 | Roscheisen et al. | 136/263 |
| 2006/0011904 A1 | 1/2006 | Snyder et al. | |
| 2008/0011349 A1 | 1/2008 | Raffaele et al. | |
| 2008/0092953 A1 | 4/2008 | Lee | |
| 2011/0146774 A1 * | 6/2011 | Kim et al. | 136/255 |
| 2013/0000727 A1 * | 1/2013 | Iwata et al. | 136/261 |

OTHER PUBLICATIONS

Woo et al., "Individually addressable epitaxial ferroelectric nanocapacitor arrays with near Tb inch-2 density", Nature Nonotechnology, 2008, pp. 402-407, vol. 3, Jun. 15, 2008.

* cited by examiner

*Primary Examiner* — Zandra Smith
*Assistant Examiner* — Pamela E Perkins
(74) *Attorney, Agent, or Firm* — The Webb Law Firm

(57) ABSTRACT

The present invention provides a semiconductor based photovoltaic device and a manufacturing method thereof. The semiconductor based photovoltaic device is able to absorb light with a wide band wavelength, and has high photoelectric conversion efficiency since it has high electron-hole pair separation efficiency. More specifically, the method for manufacturing the photovoltaic device comprises the steps of: a) forming a thin semiconductor quantum dot film on a p or n-type semiconductor substrate, wherein the thin semiconductor quantum dot film includes semiconductor quantum dots inside a medium at which the same type of impurities as the semiconductor substrate are doped; b) forming a pore array through partial etching, wherein the pore array penetrates the thin semiconductor quantum dot film; c) depositing a semiconductor in which complementary impurities to the semiconductor substrate are doped on the thin semiconductor quantum dot film at which the pore array is formed; and d) forming sequentially a transparent conductive film and an upper electrode on the semiconductor in which the complementary impurities are doped and forming a lower electrode at a lower portion of the semiconductor substrate.

12 Claims, 9 Drawing Sheets

200

↓ mask fabrication

↓ RIE

QUANTUM DOT PHOTOVOLTAIC DEVICE AND MANUFACTURING METHOD THEREOF

TECHNICAL FIELD

The present invention relates to a semiconductor based photovoltaic device, which enables the absorption of light over a wide wavelength range and has high electron-hole pair separation efficiency so that it exhibits high photoelectric conversion efficiency, and a manufacturing method thereof, and particularly to a high-efficiency semiconductor based photovoltaic cell in which semiconductor quantum dots are provided in the p layer or n layer and the p-n junction has a large-area vertical junction structure, and to a method of manufacturing the same.

BACKGROUND ART

Research into various materials used in photovoltaic devices in addition to silicon in order to reduce the manufacturing cost and increase the efficiency has been carried out. However, because of the properties of the photovoltaic devices that use the semiconductor principle, these devices have much lower efficiency and a shorter lifespan due to degradation, compared to silicon based photovoltaic devices, and thus the actual market occupation rate thereof is as low as about 3%.

In the silicon based photovoltaic devices, silicon monocrystals or silicon polycrystals are mainly used, and upon construction of a photovoltaic system, the silicon material and wafer costs are more than 40% of the total construction cost. With the goal of substantially solving this problem, a lot of effort is being directed to reducing the amount of silicon necessary for unit power production through morphology/engineering approach and to minimizing consumption of silicon in thin-film type devices.

In order to reduce the amount of silicon necessary for unit power production, the quantity of light absorbed per mass of silicon should be increased, the electron-hole pair production efficiency should be increased upon light absorption, and the produced electron-hole pair should be prevented from recombining and should be effectively separated.

In the case of conventional horizontal junction photovoltaic devices in which the p-n or p-i-n junction is parallel to the substrate, the light absorbing layer of the photovoltaic device is confined to the depletion layer or neutral layer (i) having a planar structure formed on the p-n junction. In the conventional horizontal junction photovoltaic device, when the light absorbing layer (the p-n depletion layer, or the i layer) is formed thick, a large amount of light may be absorbed, but the distance between opposite electrodes of the junction may increase, undesirably reducing the electric field, making it difficult to separate the electron-hole pairs. Hence, limitations are imposed on increasing the thickness of the junction. Also, the light wavelength range over which light is able to be absorbed becomes very narrow, and so the theoretical conversion efficiency is known to be less than 30%.

DISCLOSURE

Technical Problem

Accordingly, the present invention has been made keeping in mind the problems encountered in the related art, and an object of the present invention is to provide a semiconductor photovoltaic device, in which the absorption of light is possible over a wide wavelength range, the electron-hole pair separation efficiency is high and the region of a light absorbing layer may be maximized so that high photoelectric conversion efficiency is exhibited, and a manufacturing method thereof, and specifically to provide a high-efficiency photovoltaic device, in which semiconductor quantum dots are provided in the region of a light absorbing layer to thus enable the absorption of light over the wide wavelength range, the p-n junction has a vertical and radial junction structure to thus maximize the contact area between the semiconductor quantum dots and the p layer/n layer, and electrons-holes may be effectively separated by the drift in an electric field even when there are many defects as in amorphous semiconductors, and a method of manufacturing the high-efficiency photovoltaic device using a simple and economic process.

Technical Solution

According to the present invention, a method of manufacturing a photovoltaic device comprises a) forming, on the upper surface of a p-type or n-type semiconductor substrate, a thin semiconductor quantum dot film in which semiconductor quantum dots are formed in a medium doped with the same type of impurities as the semiconductor substrate; b) forming an array of pores which perforate the thin semiconductor quantum dot film using partial etching; c) depositing a semiconductor doped with complementary impurities to the semiconductor substrate on the thin semiconductor quantum dot film having the array of pores; and d) sequentially forming a transparent conductive film and an upper electrode on the semiconductor doped with the complementary impurities, and forming a lower electrode on the lower surface of the semiconductor substrate.

The p-type or n-type semiconductor substrate may comprise a semiconductor substrate doped with p-type impurities or n-type impurities, and may comprise a semiconductor (p-type) substrate through which current flows by transport of holes or a semiconductor (n-type) substrate through which current flows by transport of electrons, depending on the properties of the semiconductor material itself.

The same type of impurities as the semiconductor substrate means those impurities whereby a medium produces a charge carrier that is the same as that of the semiconductor substrate.

Specifically, the same type of impurities as the semiconductor substrate means the acceptor type impurities based on the material of the medium when the semiconductor substrate is a p-type, and means the donor type impurities based on the material of the medium when the semiconductor substrate is an n-type.

The complementary impurities to the semiconductor substrate means those impurities that produce a charge carrier that is different from that of the p-type or n-type semiconductor substrate, and specifically means the donor type impurities when the semiconductor substrate is a p-type, and means the acceptor type impurities when the semiconductor substrate is an n-type.

The semiconductor doped with the complementary impurities to the semiconductor substrate means a semiconductor having a charge carrier that is different from the charge carrier of the semiconductor substrate, and specifically means a semiconductor having holes as the charge carrier when the charge carrier of the semiconductor substrate is electrons, and also means a semiconductor having electrons as the charge carrier when the charge carrier of the semiconductor substrate is holes.

The semiconductor substrate or the semiconductor doped with the complementary impurities to the semiconductor substrate may include a Group 4 semiconductor including Si, Ge, a Group 3-5 semiconductor including GaAs, InP, an oxide semiconductor, a nitride semiconductor.

In terms of crystal morphology, the semiconductor substrate or the semiconductor doped with the complementary impurities to the semiconductor substrate may be monocrystalline, polycrystalline or amorphous.

The medium is a semiconductor nitride, a semiconductor oxide or a mixture thereof, and the semiconductor nitride, the semiconductor oxide or the mixture thereof is a nitride, an oxide or a mixture thereof of the element for the semiconductor substrate.

Preferably, the semiconductor substrate or the semiconductor doped with the complementary impurities to the semiconductor substrate comprises a Group 4 semiconductor, and the medium is an oxide, a nitride or a mixture thereof of the Group 4 element.

The pores which perforate the thin semiconductor quantum dot film means pores that perforate the thin semiconductor quantum dot film in a thickness direction, and perforating is performed such that the pores are formed up to a predetermined thickness of the p-type or n-type semiconductor substrate provided on the lower surface of the thin semiconductor quantum dot film, as well as the thin semiconductor quantum dot film.

The array of pores means pores that perforate a thin semiconductor quantum dot film including a plurality of semiconductor quantum dots which are physically separated, and the array of pores means that the pores that perforate the thin semiconductor quantum dot film are regularly arranged, and individual pores have six adjacent pores.

In the manufacturing method, a) may comprise a1-1) and a1-2), or a2-1) and a2-2), as will be described below.

Specifically, a) may comprise a1-1) repetitively forming a medium layer containing a semiconductor nitride, a semiconductor oxide or a mixture thereof doped with the same type of impurities as the semiconductor substrate and a semiconductor layer on the upper surface of the semiconductor substrate, thus forming a multilayered composite layer; and a1-2) annealing the multilayered composite layer so that semiconductor quantum dots are formed in the medium comprising the semiconductor nitride, the semiconductor oxide or the mixture thereof doped with the same type of impurities as the semiconductor substrate, followed by performing annealing in a hydrogen atmosphere, thus linking nonbonding electrons of the semiconductor quantum dots with hydrogen.

Specifically, a) may comprise a2-1) forming, on the upper surface of the semiconductor substrate, a non-stoichiometric compound layer containing a semiconductor oxide, a semiconductor nitride or a mixture thereof doped with the same type of impurities as the semiconductor substrate and having an oxygen or nitrogen deficient non-stoichiometric ratio; and a2-2) annealing the non-stoichiometric compound layer thus forming semiconductor quantum dots in the medium containing the semiconductor nitride, the semiconductor oxide or the mixture thereof doped with the same type of impurities as the semiconductor substrate, and then performing annealing in a hydrogen atmosphere thus linking nonbonding electrons of the semiconductor quantum dots with hydrogen.

Upon a1-1), the multilayered composite layer is preferably formed using deposition including PVD (Physical Vapor Deposition), CVD (Chemical Vapor Deposition) or ALD (Atomic Layer Deposition), and the medium layers and the semiconductor layers which constitute the multilayered composite layer have each independently a thickness ranging from 1 nm to 5 nm.

More preferably, the semiconductor layers of the multilayered composite layer have different thicknesses, and the semiconductor layers become larger in thickness as they are positioned closer to the semiconductor substrate.

As such, the non-stoichiometric compound layer in a2-1) is formed using deposition including PVD (Physical Vapor Deposition), CVD (Chemical Vapor Deposition) or ALD (Atomic Layer Deposition), and the semiconductor oxide or semiconductor nitride contained in the non-stoichiometric compound layer has an oxygen or nitrogen deficiency of 0~50% compared to the oxygen or nitrogen content necessary for bonding which satisfies a stoichiometric ratio, and also has an oxygen or nitrogen content gradient in the thickness direction of the non-stoichiometric compound layer.

The oxygen or nitrogen content gradient includes a discontinuous gradient or a continuous gradient, and includes a gradient in which the oxygen or nitrogen content of the non-stoichiometric compound layer varies in a depth direction.

The semiconductor oxide or semiconductor nitride contained in the non-stoichiometric compound layer is preferably such that the oxygen or nitrogen content decreases towards the semiconductor substrate. Specifically, the oxygen or nitrogen content gradient is such that the oxygen or nitrogen content decreases continuously or discontinuously towards the semiconductor substrate.

Furthermore, b) comprises partially etching the multilayered composite layer or the non-stoichiometric compound layer which was annealed and hydrogenated thus manufacturing a low-dimensional nanostructure in a top-down manner, and specifically comprises b1) forming a mask on the upper surface of the thin semiconductor quantum dot film; and b2) transferring the pattern of the mask using RIE (Reactive Ion Etching) thus forming an array of pores that perforate the thin semiconductor quantum dot film.

The short-axis diameter of the pores formed using RIE in b2) may range from 20 nm to 1000 nm.

Preferably, the photovoltaic device is a silicon photovoltaic device; the semiconductor quantum dots are silicon quantum dots; and the medium is silicon oxide, silicon nitride or a mixture thereof.

Specifically, the p-type or n-type semiconductor substrate is a p-type or n-type silicon substrate, the semiconductor doped with complementary impurities to the semiconductor substrate is n-type or p-type silicon doped with complementary impurities to the silicon substrate, the semiconductor quantum dots are silicon quantum dots, and the medium is silicon oxide, silicon nitride or a mixture thereof.

According to the present invention, a photovoltaic device comprises a lower electrode; an n-type or p-type first semiconductor layer formed on the lower electrode; a porous semiconductor quantum dot layer having a plurality of semiconductor quantum dots formed in a medium doped with the same type of impurities as the first semiconductor layer and including a plurality of through pores; a second semiconductor layer in contact with the porous semiconductor quantum dot layer and comprising a semiconductor material doped with complementary impurities to the first semiconductor layer; and a transparent conductive film and an upper electrode sequentially formed on the second semiconductor layer.

The medium is a semiconductor nitride, a semiconductor oxide or a mixture thereof, and the semiconductor nitride, the semiconductor oxide or the mixture thereof is a nitride, an oxide or a mixture thereof of the element for the semiconductor substrate.

The through pores formed in the porous semiconductor quantum dot layer means pores which perforate the medium having the plurality of semiconductor quantum dots in a thickness direction, and the through pores formed in the porous semiconductor quantum dot layer include pores which are formed up to a predetermined depth of the first semiconductor layer provided on the lower surface of the porous semiconductor quantum dot layer.

The plurality of through pores means that the plurality of through pores which are physically separated from each other is regularly arranged, in which one through pore has six adjacent through pores.

The semiconductor quantum dots of the porous semiconductor quantum dot layer have different sizes, and become larger in size as they are positioned closer to the first semiconductor layer.

Specifically, the semiconductor quantum dots of the porous semiconductor quantum dot layer have a size gradient in the thickness direction of the porous semiconductor quantum dot layer, and the semiconductor quantum dots becomes larger in size as they are positioned closer to the first semiconductor layer.

The photovoltaic device has a p-n junction on a surface defined by the through pores that perforate the porous semiconductor quantum dot layer, and specifically, the p-n junction is formed over the entire region of the radial surface of the nano-columns defined by the through pores.

Preferably, the photovoltaic device is a silicon photovoltaic device; the semiconductor quantum dots are silicon quantum dots; and the medium is silicon oxide, silicon nitride or a mixture thereof.

Specifically, the p-type or n-type first semiconductor layer is a p-type or n-type silicon substrate, the second semiconductor layer is n-type or p-type silicon, the semiconductor quantum dots are silicon quantum dots, and the medium is silicon oxide, silicon nitride or a mixture thereof.

Advantageous Effects

According to the present invention, a photovoltaic device is advantageous because it has a structure in which semiconductor quantum dots having various sizes are incorporated in a p layer or an n layer, thus enabling the absorption of light over a wide wavelength range, and also because it has a low-dimensional nanostructure in which a Semiconductor material doped with complementary impurities perforates in the form of a cylindrical array through the region where the semiconductor quantum dots are formed, with the semiconductor quantum dots being incorporated in the p layer or n layer, thus obtaining a large-area vertical and radial junction structure. Thereby, the contact area between the light absorbing layer and the p layer/n layer is maximized, and even when there are many defects as in amorphous silicon, electrons-holes can be effectively separated by the drift in an electric field, resulting in a high-efficiency photovoltaic device. A manufacturing method of the photovoltaic device according to the present invention is advantageous because the high-efficiency photovoltaic device in which semiconductor quantum dots are incorporated in the p layer or n layer and which has the large-area vertical and radial junction structure can be manufactured in the form of a low-dimensional nanostructure in a top-down manner without the use of a highly advanced lithographic or epitaxial process, and also because the high-efficiency photovoltaic device can be favorably manufactured using simple and easy procedures including deposition, annealing, etching and deposition, with easily controlling the size, position and density of the semiconductor quantum dots.

BRIEF DESCRIPTION OF REFERENCE NUMERALS

Figure 1:
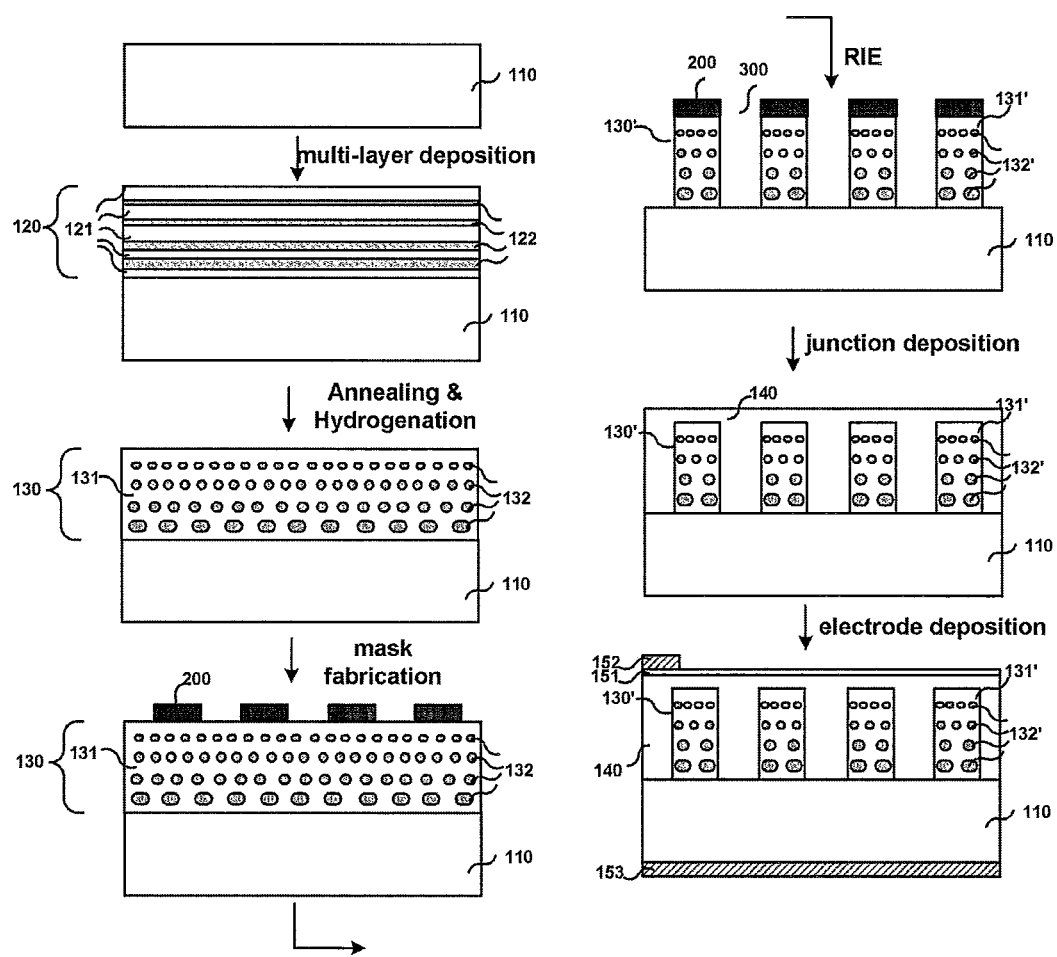
FIG. 1 illustrates a manufacturing process of a photovoltaic device according to the present invention.

110: p-type semiconductor layer
121: medium thin film (medium layer)
122: semiconductor thin film (semiconductor layer)
120: multilayered composite layer
120': non-stoichiometric compound layer
130: semiconductor quantum dot layer
131, 131': medium
132, 132': semiconductor quantum dots
130': porous semiconductor quantum dot layer having through pores
200: etching mask
210: nanoporous alumina
220: mesh type mask
300: through pores
140: n-type semiconductor
153: lower electrode
151: transparent electrode
152: upper electrode

MODE FOR INVENTION

Hereinafter, a photovoltaic device and a manufacturing method thereof according to the present invention are specified with reference to the drawings. The following drawings are illustrated in order to sufficiently convey the spirit of the present invention to those skilled in the art. Thus, the present invention is not limited to the drawings below but may be embodied in another form. Furthermore, throughout the specification, the same reference numerals are used to refer to the same elements.

The technical and scientific terms used should be interpreted as having meanings typically understood by those skilled in the art unless otherwise definitions. Moreover, descriptions of known functions and constructions, even if they are pertinent to the present invention, are regarded as unnecessary and may be omitted when they would make the characteristics of the invention unclear.

Below the present invention is described based on the drawings that illustrate a p-type semiconductor substrate (a p-type first semiconductor layer). However, in the case where the semiconductor substrate (the first semiconductor layer) is an n-type, it is apparent that a medium is doped with n-type impurities, and a semiconductor (a second semiconductor layer) doped with complementary impurities is replaced by a p-type. It is also obvious that the present invention is not limited only to the p-type semiconductor substrate (a p-type first semiconductor layer).

FIG. 1 shows a manufacturing process according to the present invention, which includes alternately depositing a medium thin film (a medium layer) 121 doped with impurities having the same electrical properties as a p-type semiconductor substrate 110, namely, p-type impurities, and a semiconductor thin film (a semiconductor layer) 122 on the upper surface of the p-type semiconductor substrate 110 using a deposition process, thus forming a multilayered composite layer 120 having a multilayer thin-film structure.

The medium thin film 121 comprises a semiconductor oxide, a semiconductor nitride or a mixture thereof, and a plurality of medium thin films 121 of the multilayered composite layer 120 may have different materials (a semiconductor oxide, a semiconductor nitride, a mixture of semiconductor oxide and semiconductor nitride) and different thicknesses, respectively.

Because semiconductor quantum dots 132 are formed by the annealing of the semiconductor thin film 122, the position, size and number of semiconductor quantum dots 132 in the medium 131 are controlled by the thickness of semiconductor thin film 122, the position (height) of semiconductor thin film 122 in the multilayered composite layer 120, and the number of semiconductor thin films 122 which constitute the multilayered composite layer 20.

Specifically, upon deposition of the multilayered composite layer 120, the medium thin film 121 and the semiconductor thin film 122 are preferably deposited to a thickness in nanometer order, and more preferably, the thicknesses of the deposited medium thin film 121 and semiconductor thin film 122 are each independently 1~5 nm.

Figure 2:
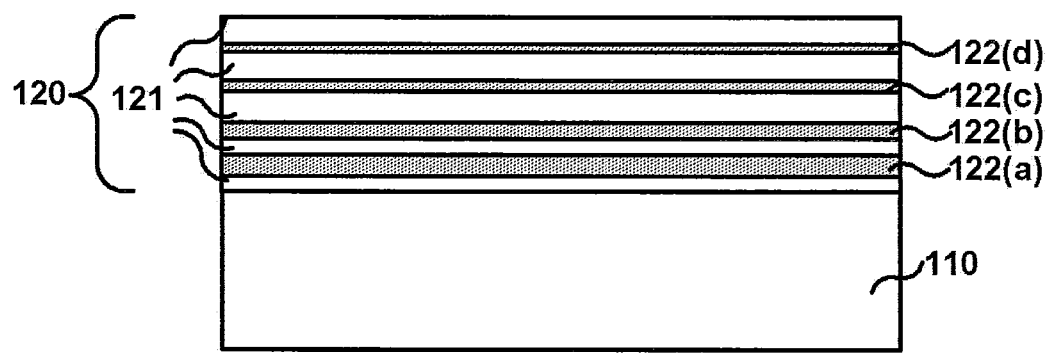
FIG. 2 illustrates a multilayered composite layer according to the present invention.

As shown in FIG. 2, the semiconductor thin films 122(*a*), 122(*b*), 122(*c*), 122(*d*) preferably become larger in thickness as they are positioned closer to the p-type semiconductor substrate 110. This is intended to manufacture larger semiconductor quantum dots 132 using annealing as they are positioned closer to the p-type semiconductor substrate 110 (as light deeply penetrates).

When the multilayered composite layer 120 is manufactured to have a thickness ranging from ones of nm to hundreds of nm, the thickness of the semiconductor quantum dot layer 130 (the thin semiconductor quantum dot film) resulting from annealing the multilayered composite layer 120 is preferably controlled to the level of from ones of nm to hundreds of nm.

Thereafter, the multilayered composite layer 120 is annealed at high temperature thus forming the semiconductor quantum dot layer 130 (the thin semiconductor quantum dot film) having the plurality of semiconductor quantum dots 132 formed in the medium 131.

The annealing transforms the semiconductor thin films 122 of the multilayered composite layer 120 into an array of semiconductor quantum dots 132 enclosed with the medium material of the medium thin film 121 using stress relief and minimization of interfacial energy as a driving force. After formation of the array of semiconductor quantum dots 132, annealing is further performed in a hydrogen atmosphere, so that nonbonding electrons of the semiconductor quantum dots 132 are linked with hydrogen.

The annealing for forming the semiconductor quantum dots 132 should be configured depending on the kind of medium, the kind of semiconductor thin film, and the size and density of quantum dots to be formed. Upon formation of the semiconductor quantum dots, if the annealing temperature is too low, it is difficult to transfer the material, making it difficult to obtain the shape of semiconductor quantum dots. In contrast, if the annealing temperature is too high, there are the dangers of the size of semiconductor quantum dots becoming very non-uniform and coarse particles in which the quantum confinement effect is insignificant being formed.

The annealing for forming the semiconductor quantum dots 132 is carried out at 1000~1200° C. when the medium is a semiconductor oxide, preferably silicon oxide ($SiO_2$), or is carried out at 800~1200° C. when the medium is a semiconductor nitride, preferably silicon nitride ($Si_3N_4$), and the annealing is preferably performed for 10~30 min.

Thereafter, hydrogenation is performed using annealing in a hydrogen atmosphere so that the nonbonding electrons of the semiconductor quantum dots are linked with hydrogen. Upon hydrogenation, the annealing temperature should be determined depending on the kind of semiconductor quantum dots. If the semiconductor quantum dots are silicon quantum dots, annealing is preferably performed at 600~700° C. for 30~90 min in a hydrogen atmosphere using a forming gas (95% Ar-5% $H_2$).

After the annealing and hydrogenation, the thin semiconductor quantum dot film 130 having the semiconductor quantum dots 132 formed in the medium 131 is partially etched in a direction perpendicular to the surface of the p-type semiconductor substrate 110, so that the array of pores 300 that perforate the semiconductor quantum dot layer 130 is manufactured in a top-down manner.

Specifically, a mask 200 is formed on the upper surface of the thin semiconductor quantum dot film 130, and RIE (Reactive Ion Etching) is performed, thus transferring the pattern of the mask 200, thereby forming the array of pores that perforate the thin semiconductor quantum dot film.

Figure 3:
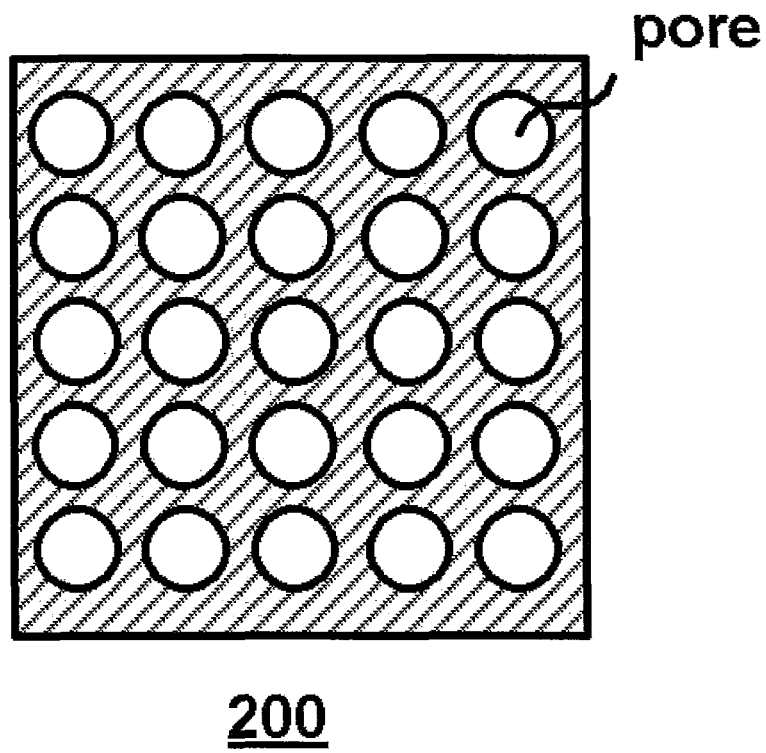
FIG. 3 illustrates a mask used for RIE according to the present invention.

As shown in FIG. 3, the mask 200 is preferably a mask in which pores (pores of FIG. 3) are regularly arranged, and may comprise a metal, a metal oxide or an organic material. FIG. 3 illustrates the case where the pores of the mask have a circular shape, but the present invention is not limited thereto.

Figure 4:
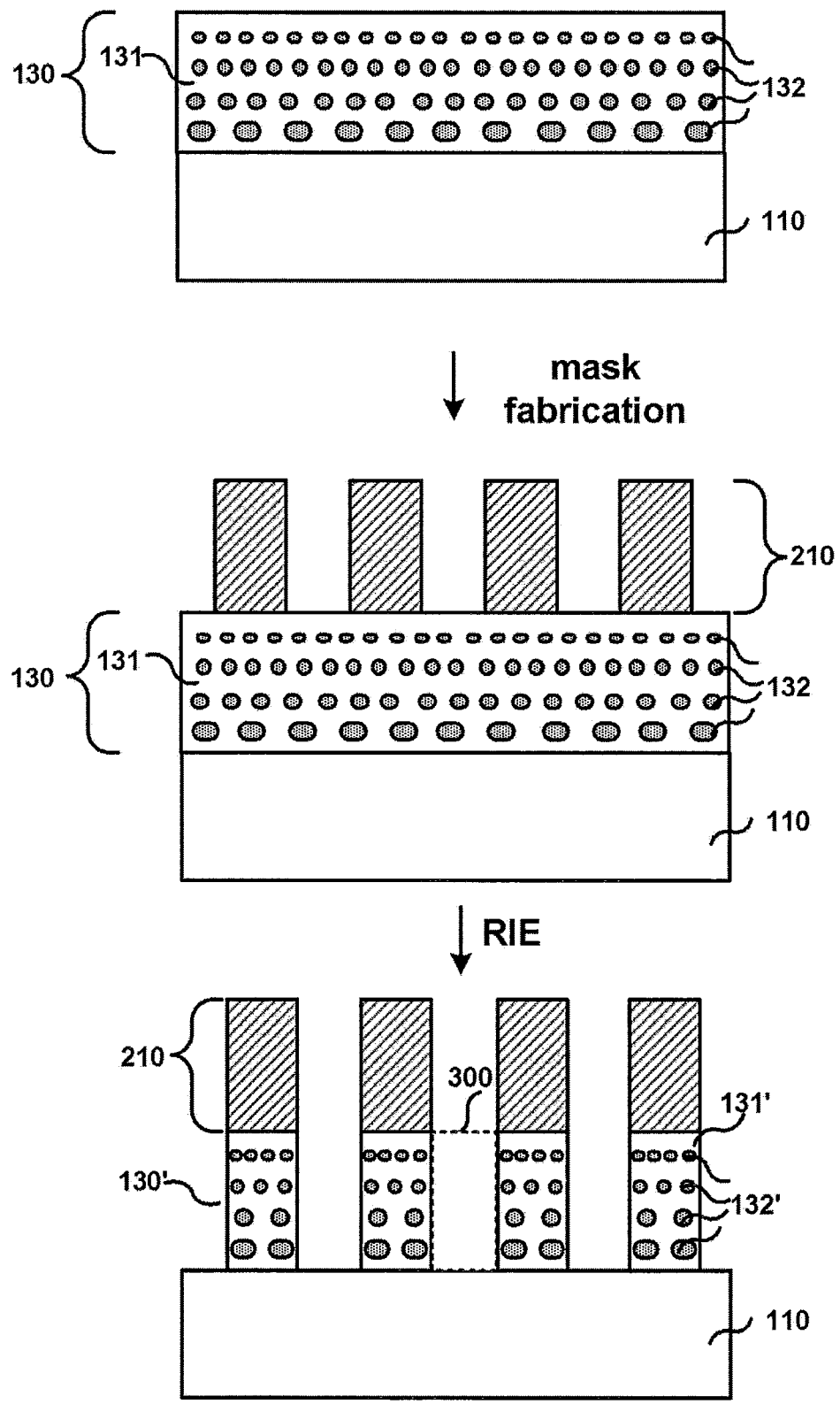
FIG. 4 illustrates RIE using nanoporous alumina according to the present invention.

Preferably, as shown in FIG. 4, an array of small through pores is formed to ensure a high specific surface area. In order to form the through pores having a short-axis diameter from 20 nm to 1000 nm, the mask 200 is preferably nanoporous alumina (AAO; anodic alumina oxide) 210. It is preferable that RIE be performed using the nanoporous alumina 210 as an etching mask, thus forming through pores 300 which perforate the semiconductor quantum dot layer 130.

The nanoporous alumina is alumina having though pores of ones of nm, which is formed by anodizing aluminum using sulfuric acid, oxalic acid or phosphoric acid as an electrolyte. The specified preparation of nanoporous alumina is disclosed in the paper by the present applicants (W. Lee et al. Nature Nanotech. 3, 402 (2008)).

Figure 5:
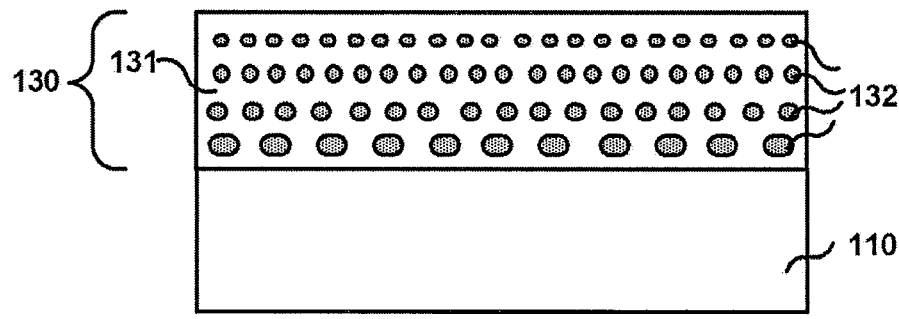
FIG. 5 illustrates RIE using a mesh type film according to the present invention.
Figure 5:
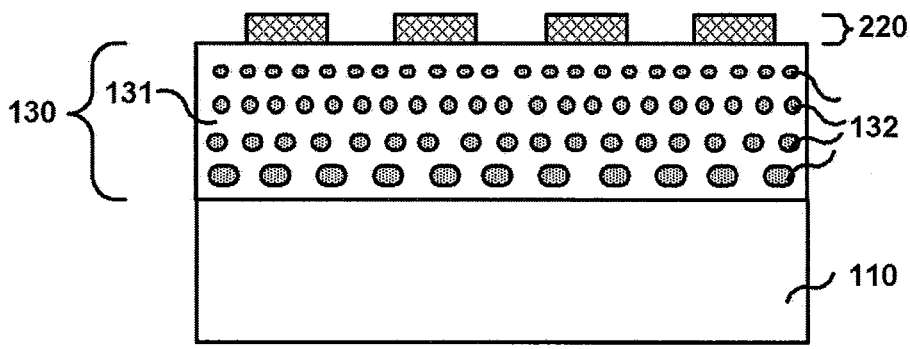
Figure 5:
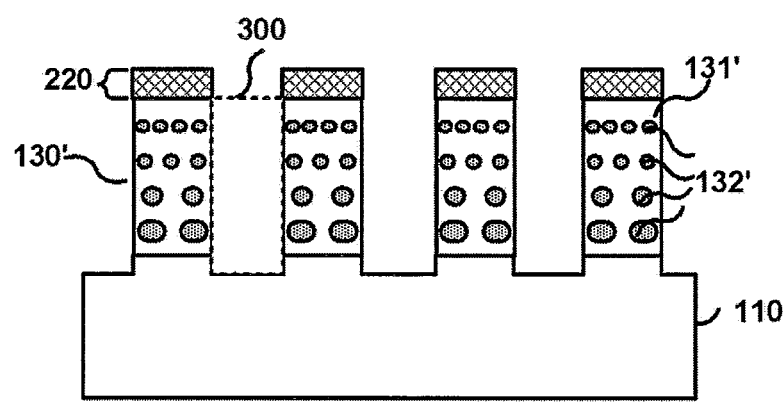

Preferably, as shown in FIG. 5, an array of small through pores is manufactured to ensure a high specific surface area, and in order to form the through pores having a short-axis diameter ranging from 20 nm to 1000 nm, a mesh type film 220 having regularly formed cavities is provided on the upper surface of the semiconductor quantum dot layer 130, and RIE (Reactive Ion Etching) is performed using the mesh type film 220 as a mask, thus forming through pores 300 that perforate the semiconductor quantum dot layer 130.

As such, the mesh type film 220 is preferably a metal film, and the mesh type metal film 220 may be manufactured using nanoporous alumina (AAO; anodic alumina oxide) as a mask.

More specifically, the metal film is deposited to a predetermined thickness on the semiconductor quantum dot layer 130, and is then etched using the nanoporous alumina as a mask, thus obtaining a mesh type metal film 220 having regularly formed circular cavities of ones of nm.

Alternatively, the semiconductor quantum dot layer 130 may be subjected to RIE to a predetermined depth in accordance with the shape of pores of nanoporous alumina using the nanoporous alumina as a mask, so that surface irregularities are formed to a predetermined depth on the surface of the semiconductor quantum dot layer 130, after which metal is deposited on the upper surface of the semiconductor quantum dot layer 130 having the surface irregularities. Upon deposition of the metal, the metal is selectively deposited on the protruding portions (the non-etched portions by RIE) of the semiconductor quantum dot layer 130 due to the surface difference thereof, thereby forming the mesh type metal film 220 having cavities with a size and arrangement similar to those of the nanoporous alumina.

After formation of the mask 200 as mentioned above, RIE is performed, whereby the through pores 300 that perforate the semiconductor quantum dot layer 130 are formed. As such, the portions of the semiconductor quantum dot layer 130 corresponding to the pores of the nanoporous alumina 210 or the cavities of the mesh type film 220 are etched. Thus, after the RIE, the semiconductor quantum dot layer 130 has a through-pore structure similar to the pore structure of the nanoporous alumina 210 or the mesh type film 220.

Figure 6:
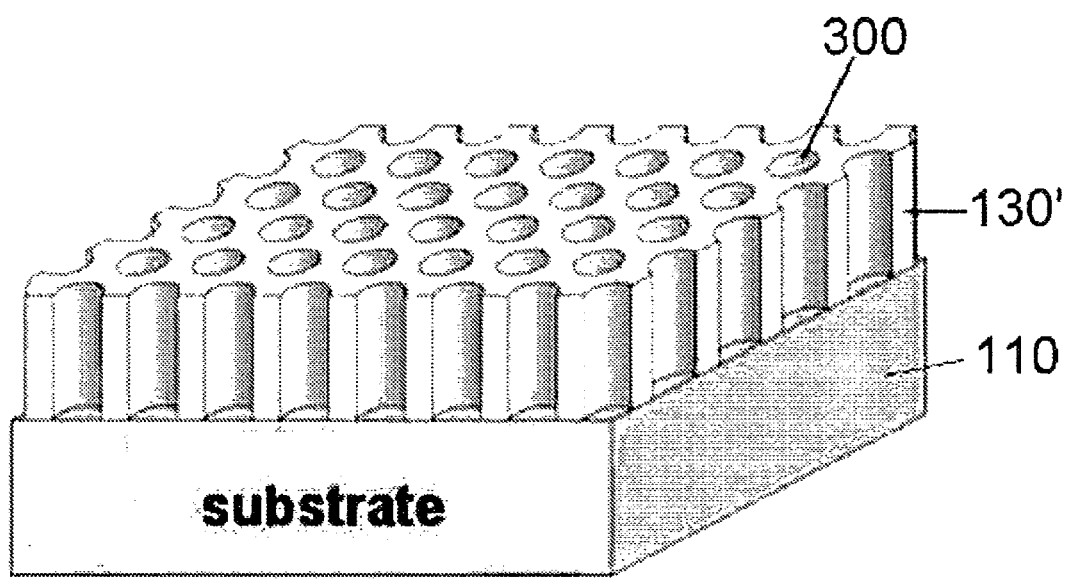
FIG. 6 illustrates a porous semiconductor quantum dot layer having through pores formed using RIE according to the present invention.

By RIE as above, as shown in FIG. 6, portions of the semiconductor quantum dot layer 130 are etched vertically, thus forming the through pores 300. The semiconductor quantum dot layer 130 is provided in the form of a mesh 130' (which is a mesh similar to the pore pattern of the mask) having a predetermined thickness.

As such, by means of partial etching of the semiconductor quantum dot layer 130, the pores 300 that perforate the semiconductor quantum dot layer 130 in a thickness direction are formed as shown in FIG. 5. Upon partial etching, etching is carried out up to a predetermined depth of the semiconductor substrate 110 positioned on the lower surface of the semiconductor quantum dot layer 130, as well as the semiconductor quantum dot layer 130, and thus the pores 300 may extend to the semiconductor substrate 110 via the semiconductor quantum dot layer 130 as shown in FIG. 6.

Upon RIE, the semiconductor quantum dots 132 may be exposed to the surface, but spontaneous oxidation occurs on the surface of the semiconductor 132 exposed to the surface by RIE, so that the semiconductor quantum dots are provided in the form of being incorporated in the medium 131'.

The short-axis diameter of the through pores 300 formed using RIE preferably ranges from 20 nm to 1000 nm. This is because the medium 130' doped with the p-type impurities having the same properties as the p-type semiconductor substrate 110 functions similarly to the p-type semiconductor substrate 110 and thus the holes of electron-hole pairs produced in the semiconductor quantum dots 132' drift in the internal electric field formed in the medium 130', thus generating current.

If the diameter of the through pores 300 is too large, the semiconductor quantum dots (the photoactive region) which are removed by etching may be increased relatively, thus reducing photoelectric efficiency. In contrast, if the diameter of the through pores 300 is too small, direct current resistance may increase thus reducing photoelectric efficiency.

Thereafter, an n-type semiconductor doped with complementary impurities to the medium 131' and the semiconductor substrate 110 is deposited on the upper surface of the semiconductor quantum dot layer 130' having the array of through pores 300 and also inside the through pores 300.

As shown in FIG. 1, deposition is conducted in such a manner that all the empty spaces (the array of through pores) formed by partial etching of the semiconductor quantum dot layer 130 on the upper surface of the p-type semiconductor substrate 110 are filled with the n-type semiconductor 140, and the semiconductor quantum dot layer 130' is completely covered, and thus only the n-type semiconductor 140 is present on the surface, thereby forming the p-n junction.

Figure 7:
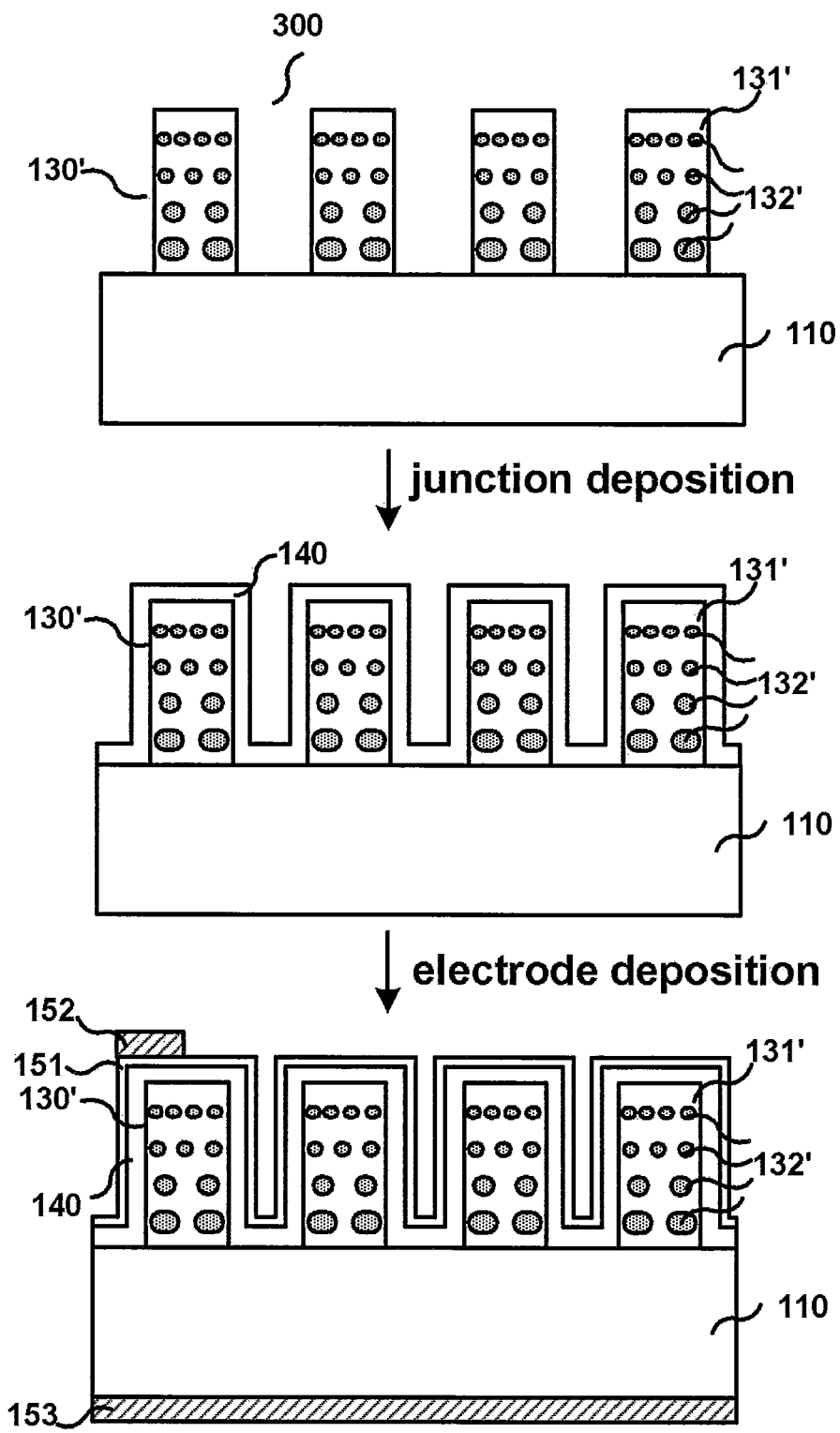
FIG. 7 illustrates forming a p-n junction in the manufacturing process according to the present invention.

Alternatively, as shown in FIG. 7, deposition may be conducted in such a manner that the n-type semiconductor 140 is deposited on the surface (including the surface formed by the through pores) of the porous semiconductor quantum dot layer 130 so that all the empty spaces (the array of through pores) formed by partial etching are not filled, thus forming the p-n junction.

Thereby, the p-n junction is formed in accordance with the shape of outer surface of the through pores 300 between the medium 131' doped with the p-type impurities and the p-type semiconductor substrate 110 and the n-type semiconductor 140, so that the holes of the electron-hole pairs produced in the semiconductor substrate 110 and the semiconductor quantum dot layer 132' are transferred to the p-type semiconductor substrate 110 via the medium 131' and the electrons thereof are transferred to the n-type semiconductor charged in the through pores 300, thus separating the holes and the electrons.

As such, the deposition of the n-type semiconductor 140 results in the formation of the p-n junction having a vertical and radial junction structure in accordance with the outer surface of the through pores 300, and the semiconductor quantum dots 132' are incorporated in the medium 131' that extends from the p-type semiconductor substrate 110.

Preferably, the medium 131' in which the semiconductor quantum dots 132' are positioned is in a state of a built-in depletion layer by the p-n junction. This may be controlled by adjusting the concentration of doped impurities of the medium 131', the concentration of doped impurities of the n-type semiconductor, and the distance between centers of through pores 300 (and the short-axis diameter of the through pores).

Thereafter, as shown in FIG. 1 or 7, electrodes 153, 152, 151 are formed so as to face each other on the lower surface of the p-type semiconductor substrate 110 and the surface of the n-type semiconductor 140, thus manufacturing the photovoltaic device according to the present invention. The surface of the n-type semiconductor 140 is preferably a surface that receives light. As such, in order to minimize the loss of light, the electrode of the surface of the n-type semiconductor 140 preferably has a structure comprising a transparent electrode film 151 and a metal pad 152 formed on the transparent electrode film 151, and the transparent electrode film 151 is preferably formed on the entire region of the upper surface of the n-type semiconductor 140.

The electrodes 151, 152, 153 are manufactured by means of typical printing such as screen printing using a conductive metal paste or stencil printing, or deposition using PVD/CVD.

Figure 8:
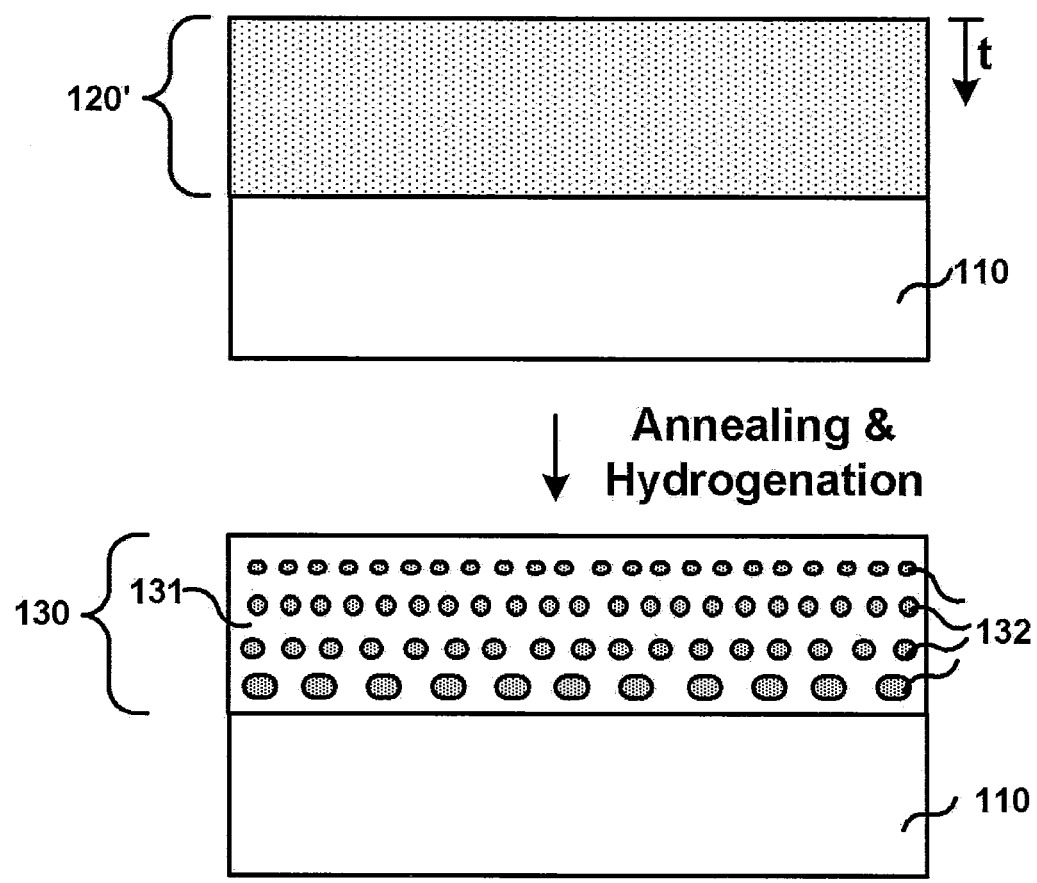
FIG. 8 illustrates manufacturing a semiconductor quantum dot layer using a non-stoichiometric compound layer in the manufacturing process according to the present invention.

As shown in FIG. 8, the semiconductor quantum dot layer 130 according to the present invention may be manufactured by annealing and hydrogenating the non-stoichiometric compound layer 120', in lieu of the multilayered composite layer 120.

The non-stoichiometric compound layer 120' which is provided on the upper surface of the p-type semiconductor substrate 110 is composed of a medium containing a semiconductor nitride, a semiconductor oxide or a mixture thereof doped with the same type of impurities as the p-type semiconductor substrate and having a non-stoichiometric ratio.

The non-stoichiometric compound layer 120' may contain a semiconductor compound having a non-stoichiometric ratio (semiconductor nitride, semiconductor oxide or a mixture thereof) and a semiconductor compound having a stoichiometric ratio (semiconductor nitride, semiconductor oxide or a mixture thereof).

The non-stoichiometric compound layer 120' is formed using deposition including PVD (Physical Vapor Deposition), CVD (Chemical Vapor Deposition) or ALD (Atomic Layer Deposition). Upon deposition, the degree of departing from the stoichiometric ratio may be controlled by adjusting the ratio of the semiconductor precursor (e.g. a silicon precursor) to oxygen or nitrogen.

The semiconductor oxide or semiconductor nitride of the medium contained in the non-stoichiometric compound layer 120' comprises a semiconductor oxide or a semiconductor nitride satisfying a stoichiometric ratio; and a semiconductor oxide or a semiconductor nitride having an oxygen or nitrogen deficiency of 50% (atomic % based on the stoichiometric ratio) or less compared to the oxygen or nitrogen content necessary for bonding based on the stoichiometric ratio, and the non-stoichiometric compound layer 120' preferably has an oxygen or nitrogen content gradient in the thickness direction (t) of the non-stoichiometric compound layer.

In the case where the semiconductor material is silicon, the semiconductor oxide having an oxygen deficiency of 50% (atomic %) or less compared to the oxygen content necessary for bonding based on the stoichiometric ratio has a composition of $SiO_2$ (stoichiometric ratio) to SiO (50% deficiency), and the semiconductor nitride having a nitrogen deficiency of 50% (atomic %) or less compared to the nitrogen content necessary for bonding based on the stoichiometric ratio has a composition of $Si_3N_4$ (stoichiometric ratio) to $Si_3N_2$ (50% deficiency).

The semiconductor oxide or semiconductor nitride contained in the non-stoichiometric compound layer 120' is preferably such that the nitrogen deficiency or oxygen deficiency in the stoichiometric ratio increases towards the semiconductor substrate. Specifically, the oxygen or nitrogen composition contained in the non-stoichiometric compound layer 120' decreases in proportion to an increase in the depth t of the non-stoichiometric compound layer 120'. This is intended to control the size of the quantum dots depending on the depth of the non-stoichiometric compound layer 120' of the semiconductor quantum dots produced using the composition departing from the stoichiometric ratio as a driving force upon annealing of the non-stoichiometric compound layer 120', and to form larger semiconductor quantum dots as they are positioned closer to the semiconductor substrate.

Figure 9:
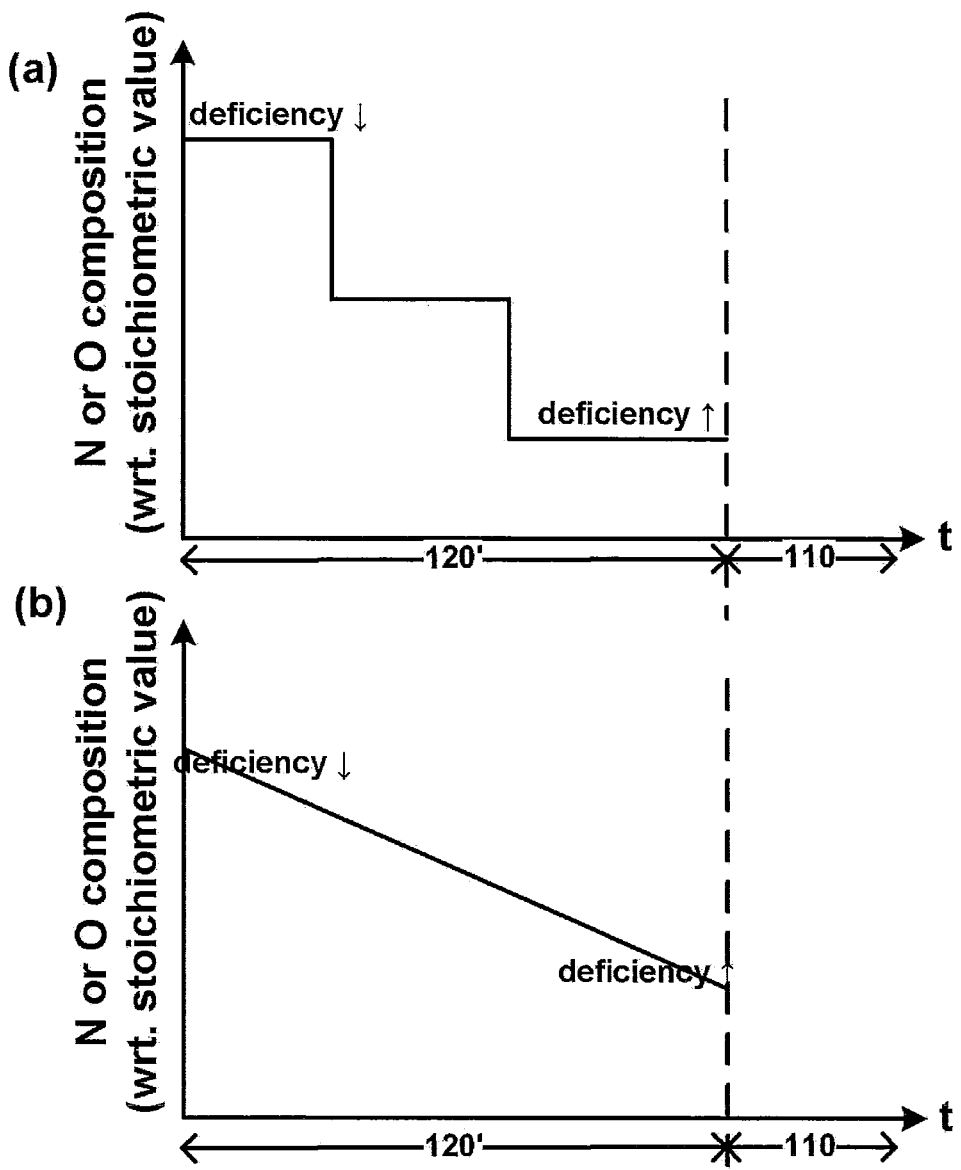
FIG. 9 illustrates the oxygen or nitrogen gradient formed in a thickness direction (t) of the non-stoichiometric compound layer according to the present invention.

Specifically, as shown in FIG. 9, the oxygen or nitrogen gradient formed in the thickness direction (t) of the non-stoichiometric compound layer 120' is a discontinuous gradient (FIG. 9(a)) which is such that the oxygen or nitrogen content decreases discontinuously towards the p-type semiconductor substrate 110, or is a continuous gradient (FIG. 9(b)) which is such that the oxygen or nitrogen content decreases continuously towards the p-type semiconductor substrate 110.

When the non-stoichiometric compound layer 120' is similarly annealed and hydrogenated to the multilayered composite layer 120, larger semiconductor quantum dots are formed in the region close to the p-type semiconductor substrate 110 having a semiconductor-rich composition by the hydrogen or nitrogen content gradient, and smaller semiconductor quantum dots are formed as they are positioned closer to the surface (as t decreases).

The photovoltaic device according to the present invention may be manufactured in a manner similar to the aforementioned method, with the exception that the semiconductor quantum dot layer 130 is formed using the non-stoichiometric compound layer 120'.

As shown in FIG. 1 or 7, the photovoltaic device according to the present invention which is preferably manufactured using the manufacturing method according to the present invention comprises a lower electrode 153; an n-type or p-type first semiconductor layer 110 formed on the lower electrode 153; a porous semiconductor quantum dot layer 130' having a plurality of semiconductor quantum dots 132' formed in a medium 131' doped with the same type of impurities as the first semiconductor layer 110 and including a plurality of through pores 300; a second semiconductor layer 140 in contact with the porous semiconductor quantum dot layer 130' and comprising a semiconductor material doped with complementary impurities to the first semiconductor layer 110; and a transparent conductive film 151 and an upper electrode 152 sequentially formed on the second semiconductor layer 140.

The medium 131' is a semiconductor nitride, a semiconductor oxide, or a mixture thereof, and the semiconductor nitride, the semiconductor oxide or the mixture thereof is a nitride, an oxide or a mixture thereof of the element for the first semiconductor layer 110.

The semiconductor quantum dots 132' of the porous semiconductor quantum dot layer 130' have different sizes, and become larger in size as they are positioned closer to the first semiconductor layer 110, and the p-n junction is formed on the surface defined by the through pores 300 that perforate the porous semiconductor quantum dot layer 130', and the medium 131' is in a state of a built-in depletion layer by the p-n junction.

The photovoltaic device manufactured by the manufacturing method according to the present invention is a silicon based photovoltaic device.

Specifically, the vertical junction semiconductor quantum dot photovoltaic device is a silicon photovoltaic device, and the semiconductor quantum dots are silicon quantum dots, and the medium is silicon oxide, silicon nitride or a mixture thereof having a stoichiometric ratio or a non-stoichiometric ratio, and the p-type semiconductor and the n-type semiconductor are respectively p-type silicon and n-type silicon. It is preferable that the p-n junction having a vertical and radial junction structure formed on the surface of the through pores 300 be a junction of silicon oxide (or silicon nitride) doped with n-type (or p-type) impurities and silicon doped with p-type (or n-type) impurities.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A method of manufacturing a photovoltaic device, comprising:
   a1-1) repetitively forming a medium layer containing a semiconductor nitride, a semiconductor oxide or a mixture thereof doped with the same type of impurities as the semiconductor substrate and a semiconductor layer on the upper surface of the semiconductor substrate, thus forming a multilayered composite layer;

a1-2) annealing the multilayered composite layer so that semiconductor quantum dots are formed in the medium containing the semiconductor nitride, the semiconductor oxide or the mixture thereof doped with the same type of impurities as the semiconductor substrate, and then performing annealing in a hydrogen atmosphere, thus linking nonbonding electrons of the semiconductor quantum dots with hydrogen;

b) forming an array of pores which perforate the thin semiconductor quantum dot film using partial etching;

c) depositing a semiconductor doped with complementary impurities to the semiconductor substrate on the thin semiconductor quantum dot film having the array of pores; and d) sequentially forming a transparent conductive film and an upper electrode on the semiconductor doped with the complementary impurities, and forming a lower electrode on a lower surface of the semiconductor substrate.

2. The method of claim 1, wherein the multilayered composite layer in a1-1) is formed using deposition including PVD (Physical Vapor Deposition), CVD (Chemical Vapor Deposition) or ALD (Atomic Layer Deposition), and the medium layer and the semiconductor layer of the multilayered composite layer have each independently a thickness ranging from 1 nm to 5 nm.

3. The method of claim 2, wherein semiconductor layers of the multilayered composite layer have different thicknesses, and become larger in thickness as they are positioned closer to the semiconductor substrate.

4. The method of claim 1, wherein b) comprises:

b1) forming a mask on an upper surface of the thin semiconductor quantum dot film; and b2) transferring a pattern of the mask using RIE (Reactive Ion Etching), thus forming the array of pores that perforates the thin semiconductor quantum dot film.

5. The method of claim 4, wherein a short-axis diameter of the pores formed using RIE in b2) ranges from 20 nm to 1000 nm.

6. The method of claim 1, wherein the photovoltaic device is a silicon photovoltaic device; the semiconductor quantum dots are silicon quantum dots; and the medium is silicon oxide, silicon nitride or a mixture thereof.

7. A method of manufacturing a photovoltaic device, comprising:

a2-1) forming, on the upper surface of the semiconductor substrate, a non-stoichiometric compound layer containing a semiconductor oxide, a semiconductor nitride or a mixture thereof doped with the same type of impurities as the semiconductor substrate and having an oxygen or nitrogen deficient non-stoichiometric ratio;

a2-2) annealing the non-stoichiometric compound layer thus forming semiconductor quantum dots in the medium containing the semiconductor nitride, the semiconductor oxide or the mixture thereof doped with the same type of impurities as the semiconductor substrate, and then performing annealing in a hydrogen atmosphere thus linking nonbonding electrons of the semiconductor quantum dots with hydrogen;

b) forming an array of pores which perforate the thin semiconductor quantum dot film using partial etching;

c) depositing a semiconductor doped with complementary impurities to the semiconductor substrate on the thin semiconductor quantum dot film having the array of pores; and d) sequentially forming a transparent conductive film and an upper electrode on the semiconductor doped with the complementary impurities, and forming a lower electrode on a lower surface of the semiconductor substrate.

8. The method of claim 7, wherein the non-stoichiometric compound layer in a2-1) is formed using deposition including PVD (Physical Vapor Deposition), CVD (Chemical Vapor Deposition) or ALD (Atomic Layer Deposition), and the semiconductor oxide or semiconductor nitride contained in the non-stoichiometric compound layer has an oxygen or nitrogen deficiency of 0~50% compared to an oxygen or nitrogen content necessary for bonding satisfying a stoichiometric ratio, and has an oxygen or nitrogen content gradient in a thickness direction of the non-stoichiometric compound layer.

9. The method of claim 8, wherein the oxygen or nitrogen content gradient is such that the oxygen or nitrogen content decreases towards the semiconductor substrate.

10. A photovoltaic device, comprising:

a lower electrode;

an n-type or p-type first semiconductor layer formed on the lower electrode;

a porous semiconductor quantum dot layer having a plurality of semiconductor quantum dots formed in a medium doped with the same type of impurities as the first semiconductor layer and including a plurality of through pores;

a second semiconductor layer in contact with the porous semiconductor quantum dot layer and comprising a semiconductor material doped with complementary impurities to the first semiconductor layer; and a transparent conductive film and an upper electrode sequentially formed on the second semiconductor layer, wherein a p-n junction is formed on a surface defined by the through pores that perforate the porous semiconductor quantum dot layer, and the medium is in a state of a built-in depletion layer by the p-n junction.

11. The photovoltaic device of claim 10, wherein the semiconductor quantum dots of the porous semiconductor quantum dot layer have different sizes, and become larger in size as they are positioned closer to the first semiconductor layer.

12. The photovoltaic device of claim 10, wherein the photovoltaic device is a silicon photovoltaic device; the semiconductor quantum dots are silicon quantum dots; and the medium is silicon oxide, silicon nitride or a mixture thereof.

* * * * *